(12) United States Patent
Lecordier et al.

(10) Patent No.: US 11,284,519 B2
(45) Date of Patent: Mar. 22, 2022

(54) ELECTRONIC BOARD COMPRISING SMDS SOLDERED ON BURIED SOLDER PADS

(71) Applicant: SAFRAN ELECTRONICS & DEFENSE, Boulogne-Billancourt (FR)

(72) Inventors: Denis Lecordier, Boulogne-Billancourt (FR); Philippe Chocteau, Boulogne-Billancourt (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 0 days.

(21) Appl. No.: 16/630,364

(22) PCT Filed: Jul. 13, 2018

(86) PCT No.: PCT/EP2018/069153
§ 371 (c)(1),
(2) Date: Jan. 10, 2020

(87) PCT Pub. No.: WO2019/012139
PCT Pub. Date: Jan. 17, 2019

(65) Prior Publication Data
US 2020/0170121 A1 May 28, 2020

(30) Foreign Application Priority Data
Jul. 13, 2017 (FR) ...................................... 1756697

(51) Int. Cl.
*H05K 1/00* (2006.01)
*H05K 1/02* (2006.01)
(Continued)

(52) U.S. Cl.
CPC ......... *H05K 3/3485* (2020.08); *H05K 3/1216* (2013.01); *H05K 3/3442* (2013.01);
(Continued)

(58) Field of Classification Search
CPC .. H05K 1/00; H05K 1/02; H05K 1/03; H05K 1/09; H05K 1/11; H05K 1/14; H05K 1/16;
(Continued)

(56) References Cited

U.S. PATENT DOCUMENTS

| 5,498,575 | A | | 3/1996 | Onishi et al. |
| 6,148,512 | A | * | 11/2000 | Brown ................. H05K 3/3452 29/837 |

(Continued)

FOREIGN PATENT DOCUMENTS

| DE | 4243356 A1 | 6/1994 |
| EP | 1261028 A2 | 11/2002 |

OTHER PUBLICATIONS

International Preliminary Report on Patentability received for PCT Patent Application No. PCT/EP2018/069153, dated Jan. 23, 2020, 13 pages (7 pages of English Translation and 6 pages of Original Document).

(Continued)

*Primary Examiner* — Xiaoliang Chen
(74) *Attorney, Agent, or Firm* — Womble Bond Dickinson (US) LLP

(57) ABSTRACT

The invention relates to a method for manufacturing (S) an electronic board (1) comprising the following steps:
 forming (S1, S4) a cavity (20) in the conductive skin layer ($C_1$) and in an underlying insulating layer (10), so that at least part of a solder pad (4) is exposed,
 filling (S5) the cavity (20) with a solder paste (24),
 placing (S6) an SMD (3) opposite the cavity (20),
 soldering the SMD (3) on the electronic board (1).

21 Claims, 8 Drawing Sheets

(51) Int. Cl.

| | |
|---|---|
| *H05K 1/03* | (2006.01) |
| *H05K 1/09* | (2006.01) |
| *H05K 1/11* | (2006.01) |
| *H05K 1/14* | (2006.01) |
| *H05K 1/16* | (2006.01) |
| *H05K 1/18* | (2006.01) |
| *H05K 3/00* | (2006.01) |
| *H05K 3/02* | (2006.01) |
| *H05K 3/04* | (2006.01) |
| *H05K 3/06* | (2006.01) |
| *H05K 3/18* | (2006.01) |
| *H05K 3/28* | (2006.01) |
| *H05K 3/30* | (2006.01) |
| *H05K 3/34* | (2006.01) |
| *H05K 3/36* | (2006.01) |
| *H05K 3/40* | (2006.01) |
| *H05K 3/46* | (2006.01) |
| *H01L 21/02* | (2006.01) |
| *H01L 21/44* | (2006.01) |
| *H01L 21/48* | (2006.01) |
| *H01L 21/58* | (2006.01) |
| *H01L 21/60* | (2006.01) |
| *H01L 23/00* | (2006.01) |
| *H01L 23/04* | (2006.01) |
| *H01L 23/13* | (2006.01) |
| *H01L 23/14* | (2006.01) |
| *H05K 3/12* | (2006.01) |

(52) U.S. Cl.
CPC ............... *H05K 2201/095* (2013.01); *H05K 2203/0207* (2013.01)

(58) Field of Classification Search
CPC .. H05K 1/18; H05K 3/00; H05K 3/02; H05K 3/04; H05K 3/06; H05K 3/18; H05K 3/28; H05K 3/30; H05K 3/34; H05K 3/36; H05K 3/40; H05K 3/46; H05K 3/48; H05K 3/498; H01L 21/02; H01L 21/44; H01L 21/48; H01L 21/58; H01L 21/60
USPC ....... 361/760, 748, 761, 763, 765, 783, 790, 361/803; 174/250, 251, 257, 258, 259, 174/260, 261, 262, 264, 268; 257/432, 257/433, 686, 698, 700, 702, 738; 438/125, 396
See application file for complete search history.

(56) References Cited

U.S. PATENT DOCUMENTS

| | | | |
|---|---|---|---|
| 7,155,821 B1 | 1/2007 | Downes et al. | |
| 8,400,776 B2* | 3/2013 | Sahara | H05K 1/0306 361/765 |
| 8,446,736 B2* | 5/2013 | Kita | H01L 21/481 361/790 |
| 8,519,270 B2* | 8/2013 | Chang | B32B 38/10 174/250 |
| 9,282,626 B2* | 3/2016 | Yoo | H05K 3/4697 |
| 9,578,745 B2* | 2/2017 | Yoshikawa | H05K 3/4007 |
| 9,723,729 B2* | 8/2017 | Furusawa | H05K 3/4697 |
| 9,848,492 B2* | 12/2017 | Lee | H05K 3/061 |
| 9,894,764 B2* | 2/2018 | Lee | H05K 3/4682 |
| 9,999,131 B2* | 6/2018 | Ko | H01L 24/13 |
| 10,039,184 B2* | 7/2018 | Wu | H05K 3/0044 |
| 10,306,778 B2* | 5/2019 | Lee | H05K 3/4007 |
| 2002/0084314 A1* | 7/2002 | Kim | H05K 3/0094 228/225 |
| 2002/0187585 A1* | 12/2002 | Tsukada | H05K 1/112 438/106 |
| 2004/0212030 A1* | 10/2004 | Asai | G02B 6/12002 257/432 |
| 2006/0043568 A1* | 3/2006 | Abe | H01L 23/13 257/698 |
| 2008/0142254 A1* | 6/2008 | Wang | H05K 1/183 174/259 |
| 2008/0237767 A1* | 10/2008 | Chan | H01L 24/11 257/433 |
| 2008/0257596 A1* | 10/2008 | Kaneko | H01L 24/16 174/264 |
| 2009/0026604 A1* | 1/2009 | Shin | H01L 23/13 257/702 |
| 2009/0096098 A1* | 4/2009 | Yang | H01L 24/19 257/738 |
| 2009/0301771 A1* | 12/2009 | Ochi | H01L 24/11 174/260 |
| 2009/0308651 A1* | 12/2009 | Abe | H05K 3/445 174/264 |
| 2010/0252303 A1* | 10/2010 | Chang | H05K 3/0035 174/251 |
| 2012/0181074 A1* | 7/2012 | Ishihara | H05K 3/4697 174/261 |
| 2012/0229990 A1* | 9/2012 | Adachi | H05K 3/4608 361/748 |
| 2012/0247818 A1* | 10/2012 | Adachi | H05K 3/445 174/257 |
| 2013/0020120 A1* | 1/2013 | Ishihara | H05K 3/4697 174/262 |
| 2013/0100626 A1* | 4/2013 | Inoue | H01L 23/49811 361/783 |
| 2014/0138130 A1* | 5/2014 | Chang | H05K 3/4697 174/257 |
| 2014/0144675 A1* | 5/2014 | Hsu | H05K 3/4694 174/251 |
| 2014/0158414 A1* | 6/2014 | Baldwin | H05K 3/4697 174/260 |
| 2015/0036305 A1* | 2/2015 | Nanjo | H05K 3/4679 361/761 |
| 2015/0062849 A1* | 3/2015 | Adachi | H01L 24/19 361/761 |
| 2016/0181145 A1* | 6/2016 | Hossain | H01L 23/642 438/125 |
| 2017/0207196 A1* | 7/2017 | Lee | H01L 23/13 |

OTHER PUBLICATIONS

Preliminary Research Report received for French Application No. 1756697, dated Mar. 21, 2018, 4 pages (1 page of French Translation Cover Sheet and 3 pages of original document).

Written Opinion received for PCT Patent Application No. PCT/EP2018/069153, dated Mar. 4, 2019, 10 pages (5 pages of English Translation and 5 pages of Original Document).

International Search Report received for PCT Patent Application No. PCT/EP2018/069153, dated Mar. 4, 2019, 6 pages (2 pages of English Translation and 4 pages of Original Document).

Office Action received for European Patent Application No. 18738345.0, dated Dec. 16, 2020, 8 pages.

Office Action received for European Patent Application No. 18738345.0, dated Jun. 9, 2021, 9 pages.

\* cited by examiner

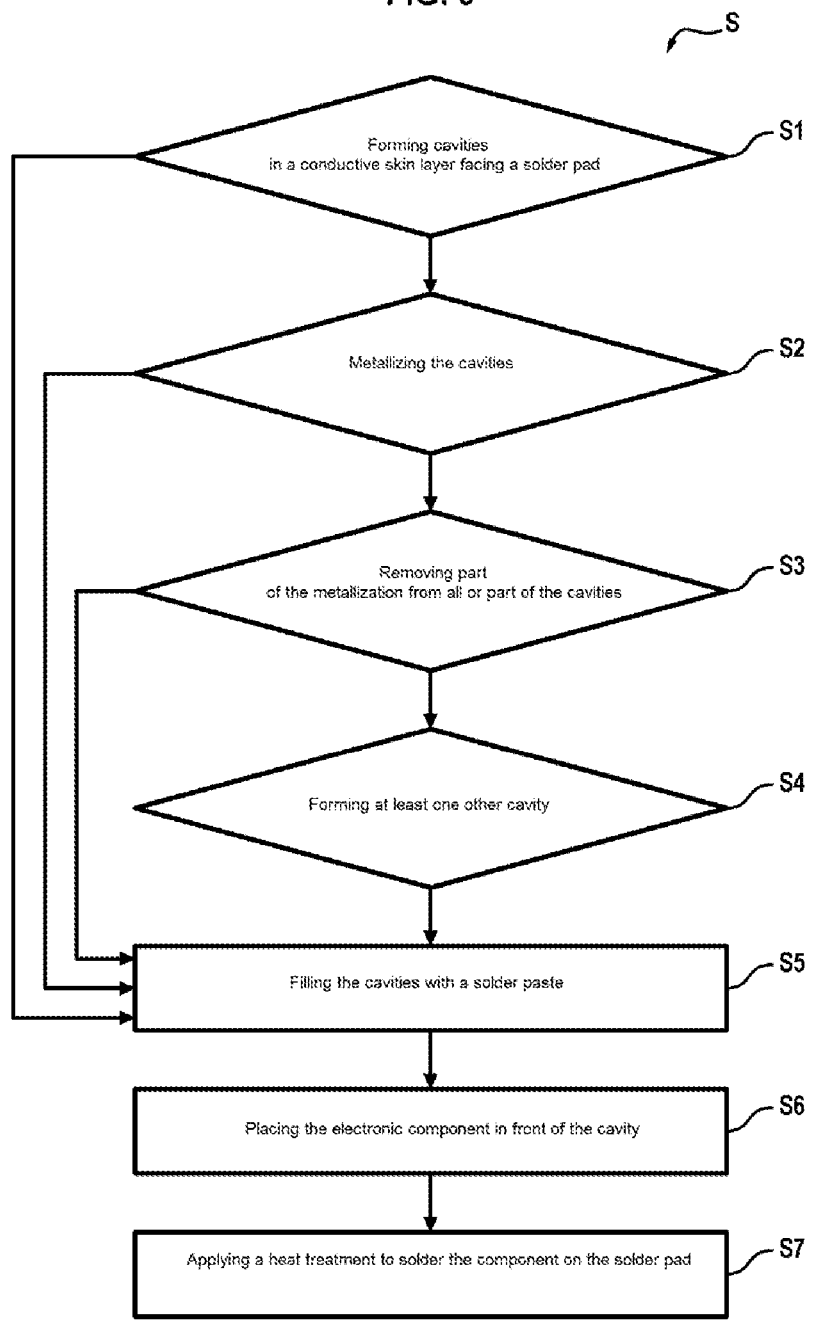

ELECTRONIC BOARD COMPRISING SMDS SOLDERED ON BURIED SOLDER PADS

FIELD OF THE INVENTION

The invention relates to the field of electronic boards, in particular in the field of aeronautics and space, and more specifically the attachment of surface-mounted components on printed circuits.

TECHNOLOGICAL BACKGROUND

In a manner known per se, an electronic board can comprise surface-mounted components (SMD), that is to say electronic components soldered directly to the surface of the printed circuit of an electronic board.

Usually, the SMDs are soldered on the surface either by reflow soldering or by solder wave.

In the case of reflow soldering, the bare printed circuit is first screen printed by covering the conductive layers of the printed circuit (generally copper) with a solder paste using a screen-printing screen (or stencil) so that only the locations intended to receive the terminals of the components are covered by the solder paste. The solder paste comprises, in a manner known per se, a metal alloy suspended in a solder flux. Then the terminals of the components (SMD) are placed on the solder paste before undergoing a reflow heat treatment, during which the heat melts the alloy and evaporates the solder flux so as to form solder joints from of the metal alloy present in the solder paste.

The reliability and the service life of the solder joints, which attach the SMDs to the printed circuit, depend on the vertical height (usually designated by the term "standoff") between the upper face of the copper solder pad and the low point of the conductive terminals of the SMDs once soldered. Therefore, the standoff corresponds to the height of the alloy at the interface between the SMD and the copper layer. In fact, in use, the SMD and the surface on which it is soldered expand differently, causing relative displacements in particular in the surface plane (X, Y). Thus, the larger the standoff, the more flexible, and therefore robust, the solder joint is.

Nevertheless, the increase in the standoff is limited by the usual assembly means available during production and by the diversity of the geometries of the component packages to be soldered on the surface.

Therefore, it has been proposed to increase the amount of solder paste applied on the layers of the printed circuit. For this purpose, the size (width) of the orifices in the screen-printing screen can for example be increased, so that during the reflow step, the height of the solder joint is increased by the effect of coalescence: the thickness of the solder joint is greater than the equivalent thickness of the alloy obtained after reflow with smaller orifices in the screen-printing screen, since the metal alloy cannot spread beyond the layers of the printed circuit by wettability effect in its liquid phase (liquidus) during reflow. This method effectively allows increasing the standoff. However, this remains limited by the volume of solder paste that can be introduced into the orifices of the screen for reasons of demolding and coalescence limit of the solder paste without generating micro beads.

In addition, all the components of a single electronic board are subjected to common process parameters, and in particular the thickness of the stencil and the printed circuit of the board. In fact, the height of solder paste deposited on the printed circuit in order to solder several SMDs is substantially the same for each SMD, since it is deposited by screen-printing using a screen. In addition, the deposition of the solder paste by screen-printing limits the packing density of the electronic components on the printed circuit and/or the type of component that can be used, in particular in the case of fine pitch components or in the case of large components. More specifically, the size of the windows of the screen-printing screen is limited by the following condition so that the screen can be demolded without damaging the solder paste which has been deposited: the ratio between the surface of the window (in the plane of the screen, which is parallel to the plane (X, Y)) and the surface of the inner walls of the window (which extend perpendicular to the plane of the screen) must be greater than or equal to 0.66. To comply with such a ratio, when the component has a fine pitch, it is therefore necessary to reduce the thickness of the screen, which necessarily involves reducing the height of the solder paste applied on the connection face and/or to increase the window surface. On the other hand, when the component is bulky or comprises terminals of the "gull-legs", J legs or C legs type, it is necessary to increase the amount of solder paste in the orifice and therefore to favor a stencil having a high thickness. The implementation of both fine pitch SMD and large volume SMD therefore requires both a stencil of a small thickness and a stencil of a high thickness.

Certainly, there are screens having a variable thickness in order to locally increase the height of the screen orifices, and therefore the amount of solder paste deposited. Nevertheless, these variable thicknesses often involve screen-printing problems for the adjacent SMDs (unsatisfactory height of the solder paste in the adjacent orifices) and makes it difficult to optimize the implantation of the SMDs in the electronic board. In addition, the minimum and maximum thicknesses of the screen which can be considered, while guaranteeing sufficient filling of the orifices, remain insufficient to guarantee both a sufficient service life for large volume components and the possibility of soldering fine pitch components on the electronic board.

SUMMARY OF THE INVENTION

Therefore, a purpose of the invention is to propose a new method for attaching surface-mounted components on a printed circuit which allows increasing the density of the components, increasing their service life, increasing the diversity of electronic components by enabling the assembly without constraint, of various components, whether they are components with fine pitch, of large sizes, with gull wing legs, etc., this new method also being simple to perform and of moderate cost regardless of the packing density of the components on the printed circuit and/or the type of component, without impacting the assembly efficiency of the electronic board.

For this purpose, the invention proposes a method for manufacturing an electronic board, said electronic board comprising a multilayer printed circuit, said printed circuit comprising at least four conductive layers separated in pairs by insulating layers, including:
- a first and a second conductive skin layer attached on a first and a second insulating layer, respectively, the first conductive skin layer being substantially planar and defining a plane normal to an axis Z,
- a first and a second inner conductive layer, extending between the first and the second insulating layer, respectively, and separated by a third insulating layer, at least the first inner conductive layer being treated so as to form at least one solder pad, the manufacturing method being characterized in that it comprises the following steps:

forming a first cavity in the first conductive skin layer and in the first insulating layer, opposite the solder pad of the first inner conductive layer, so that at least part of the solder pad is exposed, filling the first cavity with a metal alloy accompanied by a solder flux, placing a first electronic component opposite the first cavity, applying a heat treatment to the printed circuit on which the first component is placed in order to transform the metal alloy accompanied by the solder flux into a solder joint so as to attach the first component to the printed circuit.

Some preferred but non-limiting characteristics of the manufacturing method described above are the following, taken individually or in combination:

the first cavity is formed using at least one of the following techniques: surface photolithography, laser drilling, mechanical drilling, mechanical cutting.

the method further comprises a step of metallizing the first cavity in order to deposit a metal layer in the first cavity.

the method further comprises an additional step in which part of the metal layer of the first cavity is removed prior to the step of filling the first cavity.

the partial removal of the metal layer is carried out by laser or by mechanical cutting or by mechanical drilling.

the first inner conductive layer comprises an additional solder pad and the manufacturing method further comprises the following additional steps, prior to the heat treatment step: forming a second cavity in the first insulating layer, opposite the additional solder pad, so that at least an additional part of the additional solder pad is exposed; filling the second cavity with the metal alloy accompanied by a solder flux; and placing a second electronic component opposite the second cavity, the steps of filling the first and second cavities and of placing the components being carried out substantially simultaneously.

the method further comprises a step of etching the first conductive skin layer.

the first cavity is filled in accordance with at least one of the following filling techniques: screen-printing with a screen-printing screen, screen-printing without screen-printing screen, jetting, passing through a turbulent wave, by soaking or passing through a metal alloy bath in reflow, wave soldering, manual soldering.

the second inner conductive layer is treated so as to form at least one solder pad, the manufacturing method further comprising the following steps, prior to the heat treatment step: forming a third cavity in the first insulating layer and in the third insulating layer, opposite the solder pad of the second inner conductive layer, so that at least part of the solder pad of the second inner conductive layer is exposed; filling the third cavity with the metal alloy accompanied by a solder flux; and placing a third additional electronic component opposite the third cavity.

the second inner conductive layer is treated so as to form at least one solder pad, the manufacturing method further comprising the following steps, prior to the heat treatment step: forming a fourth cavity in the second conductive skin layer and in the second insulating layer, opposite the solder pad of the second inner conductive layer, so that at least part of the solder pad of the second inner conductive layer is exposed; filling the fourth cavity with the metal alloy accompanied by a solder flux; and placing a fourth electronic component opposite the fourth cavity.

the method further comprises, prior to the heat treatment step, a step during which an additional layer comprising an electrically insulating material is applied on the first conductive skin layer, the first cavity being partly formed in said additional layer.

the electrically insulating material of the additional layer has a first coefficient of thermal expansion along the axis Z, the metal alloy has a second coefficient of thermal expansion along the axis Z, and in which the first coefficient of thermal expansion is greater than the second coefficient of thermal expansion.

an area of the first cavity, in the plane, is at least equal to $0.04\ mm^2$.

According to a second aspect, the invention also proposes an electronic board comprising a multilayer printed circuit, said printed circuit comprising at least four conductive layers separated in pairs by insulating layers, including:

a first and a second conductive skin layers attached on a first and a second insulating layer, respectively, the first conductive layer being substantially planar and defining a plane normal to an axis Z, a first and a second inner conductive layers, extending between the first and the second insulating layer, respectively, and separated by a third insulating layer, at least the first inner conductive layer being treated so as to form at least one solder pad, a first cavity, formed in the first conductive skin layer and in the first insulating layer, said first cavity exposing at least partly the solder pad, and a first surface-mounted electronic component comprising at least one terminal, said first component being in contact or at a distance from the first conductive skin layer, the terminal of the first component being attached into the first cavity by means of a solder joint.

Some preferred but non-limiting characteristics of the electronic board described above are the following, taken individually or in combination:

the first cavity comprises a metal layer of metallization.

the first cavity is partially covered by a metal layer of metallization.

the electronic board further comprises a solder mask applied on the first conductive layer and on top of the insulating layer which is at least partially exposed and/or a metallic finish applied on the first conductive skin layer and the areas of the first inner conductive layer which form the first cavity.

the first component comprises an additional terminal, said terminal being attached on the first conductive skin layer by means of a solder joint.

the second inner conductive layer is treated so as to form at least one solder pad, the electronic board further comprising: a second cavity, formed in the first insulating layer and in the third insulating layer, opposite the second inner conductive layer, and a second surface-mounted electronic component comprising at least one terminal, said second component being in contact or at a distance from the first conductive skin layer, the terminal of the second component being attached into the second cavity by means of a solder joint.

the first component also comprises an additional terminal, the second inner conductive layer is treated so as to form at least one solder pad and the electronic board further comprises an additional cavity, formed in the first insulating layer and in the third insulating layer, opposite the solder pad of the second inner conductive layer, the additional terminal of the component being attached on said solder pad in the additional cavity by means of a solder joint.

the second inner conductive layer is treated so as to form at least one solder pad, the electronic board further comprising: a fourth cavity, formed in the second conductive skin layer and in the second insulating layer, opposite the second inner conductive layer, and a fourth surface-mounted electronic component comprising at least one terminal, said fourth component being in contact or at a distance from the second conductive skin layer, the terminal of the fourth component being attached into the fourth cavity by means of a solder joint.

an area of the first cavity, in the plane, is at least equal to 0.04 mm².

BRIEF DESCRIPTION OF THE DRAWINGS

Other characteristics, purposes and advantages of the present invention will become more apparent upon reading the detailed description which follows, and with reference to the appended drawings given by way of non-limiting examples and in which:

FIG. 3a is a sectional view of another exemplary embodiment of a partial metallization of the cavities, at different depths, while FIG. 4a is a sectional view of another exemplary embodiment of a partial metallization of the cavities, at different depths, while FIG. 9 is a flowchart illustrating an example of the steps of manufacturing an electronic board in accordance with an embodiment of the invention.

DETAILED DESCRIPTION OF AN EMBODIMENT

Figure 1A:
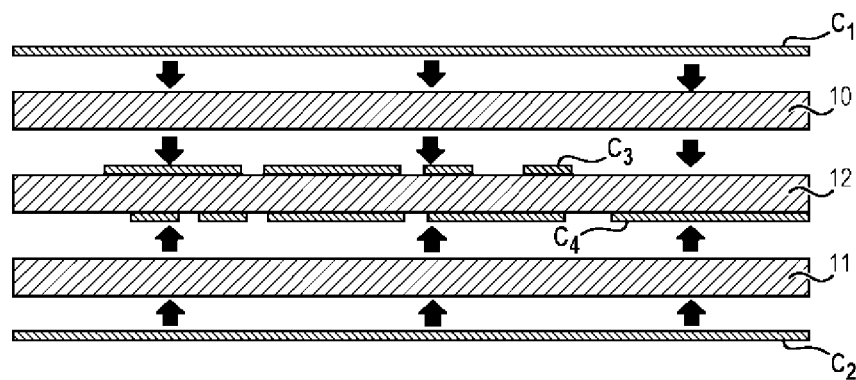
FIGS. 1a to 1l illustrate steps of an exemplary embodiment of an attachment method according to the invention.

An electronic board 1 comprises a printed circuit 2 including conductive layers separated by insulating layers 10, 11, 12, on which are attached surface-mounted electronic components (hereinafter SMD 3).

In a general manner, a printed circuit 2 can be of the monolayer type (also called single layer) and comprise only a single conductive layer, double layer (also called double face) and comprise a conductive layer on either side of an insulating or a multilayer layer and comprise at least four conductive layers.

The present invention is of particular interest when the printed circuit 2 is a multilayer printed circuit and comprises at least four conductive layers, separated in pairs by insulating layers 10, 11, 12. In the following, more particularly, the invention will be described in the case of a printed circuit 2 comprising exactly four conductive layers, including:

a first and second conductive skin layers (hereinafter layer $C_1$ and layer $C_2$, respectively) attached on a first and a second insulating layer 10 and 11, respectively, a first and second inner conductive layers (hereinafter layer $C_3$ and layer $C_4$, respectively), extending between the first and the second insulating layer 10 and 11, respectively, and separated by a third insulating layer 12.

However, this is not limiting to the extent that, as will be seen later, the invention also applies in the case where the printed circuit 2 comprises a greater number of inner conductive layers (for example layers $C_5$ and $C_6$) separated in pairs by additional insulating layers 10, 11, 12.

The layer $C_1$ is substantially planar and defines a plane (X; Y) normal to an axis Z. The layers $C_1$ and $C_2$ correspond to the layers of the printed circuit 2 located outermost from said circuit and sandwich the insulating layers 10, 11, 12 and the inner conductive layers $C_3$ and $C_4$.

In order to increase the diversity of the electronic board 1 and to improve the service life of the components, the electronic board 1 can be manufactured in accordance with the following steps:

forming S1 a cavity 20 in the layer $C_1$ (respectively, in the layer $C_2$) and in the first insulating layer 10 (respectively, in the second insulating layer 11), opposite a solder pad 4 of the layer $C_3$ or the layer $C_4$, so that at least part of the solder pad 4 is exposed, filling S5 the cavity 20 with a metal alloy accompanied by a solder flux, placing S6 a terminal 8 of the SMD 3 on the layer $C_1$ (respectively, on the layer $C_2$) opposite cavity 20, applying a heat treatment S7 to the printed circuit 2 on which the SMD is placed in order to transform the metal alloy accompanied by the solder flux into a solder joint 5 so as to attach the SMD 3 to the printed circuit 2.

An area of the cavities, in the plane (X; Y), is at least equal to 0.04 mm² in order to reach the desired service life for the SMD 3.

A depth p of the cavity 20 can for example be at least equal to 60 μm. For example, for a cavity 20 having a depth p of 60 μm, the service life is increased by 50%. For a cavity 20 having a depth p of 120 μm, the service life is increased by 100%.

As indicated above, the cavity 20 can be formed (step S1) so as to expose a solder pad 4 of the layer $C_3$ or a solder pad 4 of the layer $C_4$. Only the depth p of the cavity 20 and the number of the traversed insulating layers 10, 11, 12 changes, the steps of the method S not being modified.

Furthermore, the cavity 20 can be formed from the layer $C_1$ or from the layer $C_2$. Moreover, one or more cavity/cavities 20 can be formed both from layer $C_1$ and from layer $C_2$.

Finally, several cavities 20 can be formed in the printed circuit 2. These cavities 20 can have different depths p and therefore reach a solder pad 4 of the layer $C_3$ or of the layer $C_4$.

The number of cavities 20, their depth p (and therefore the inner conductive layer $C_3$ or $C_4$ reached) and the layer $C_1$ or $C_2$ from which the cavities 20 are formed depend on the type of SMD 3 attached on the printed circuit 2, but also the diversity and density to be achieved for the printed circuit 2.

In what follows, in order to simplify the description, more particularly the invention will be described in the case where four cavities 20 are formed in the printed circuit 2, including two cavities 20 from the layer $C_1$, opposite two solder pads 4 of layer $C_3$, and two cavities 20 from layer $C_2$, opposite two solder pads 4 of layer $C_4$. However, this is not limiting, as seen above, a different number of cavities 20 which can be formed in the printed circuit 2, from the layer $C_1$ and/or from the layer $C_2$, each of said cavities 20 being able to pass through a number of insulating layers greater than or equal to one.

Moreover, the order described above for the steps of placing the SMD 3 and filling the cavity 20 is not limiting. The SMD 3 can be placed above the cavity 20 (step S6) before or after it is filled (step S5), according to the selected filling technique. In fact, the filling step S5 can be carried out by filling the cavity 20 with a solder paste comprising a metal alloy suspended in a solder flux. In this case, the SMD 3 is placed on the solder paste (step S6), above the cavity 20. Alternatively, the cavity 20 filling step S5 can be carried out by a supply through a bath of molten alloy, in which case the SMD 3 is placed on a glue point on the layer $C_1$ (step S6) before the passage of the printed circuit 2 into the bath of molten alloy.

Figure 1B:
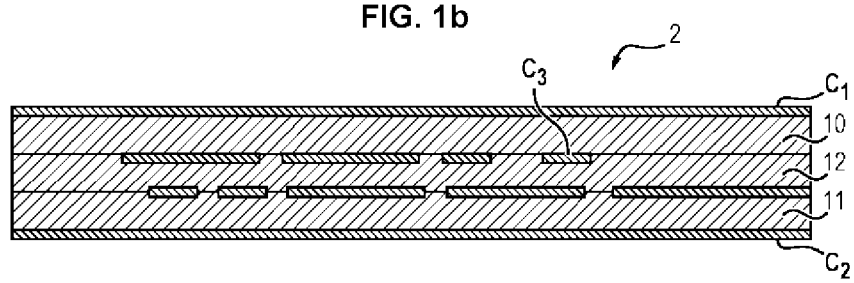
Figure 1C:
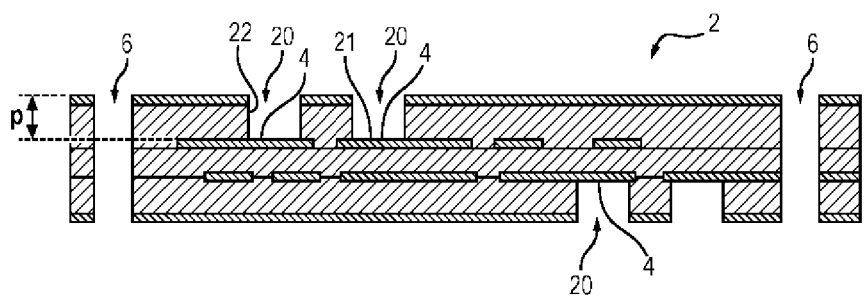

The solder pad 4 of the layer $C_3$ can be obtained, in a manner known per se, by chemical treatment of the layer $C_3$, typically by etching. This chemical treatment step can in particular be implemented during the manufacture of the printed circuit 2, prior to the step of stacking the conductive layers $C_1$ and $C_2$ and the insulating layers 10, 11, 12 intended to form the printed circuit 2. For example, the multilayer circuit can be obtained in accordance with the following sub-steps (see FIG. 1a):
  providing a double-sided printed circuit 2, that is to say comprising an insulating layer (intended to become the third insulating layer 12) and two conductive layers (intended to become the layers $C_3$ and $C_4$) on either side of the insulating layer,
  etching at least one of the layers $C_3$ and $C_4$, preferably both, in order to form solder pads 4 in the layers $C_3$ and $C_4$,
  adding and attaching another insulating layer on each layer $C_3$ and $C_4$, said insulating layers being intended to become respectively the first and the second insulating layer 10, 11 of the multilayer circuit,
  adding and attaching a conductive layer on each of the additional insulating layers 11, 12, said conductive layers being intended to become the layers $C_1$ and $C_2$, and
  temperature compressing the assembly thus formed in order to obtain the multilayer printed circuit 2. The printed circuit 2 in FIG. 1b is then obtained.

Alternatively, the multilayer circuit 2 can be directly supplied.

Where appropriate, the layers $C_1$ and $C_2$ can also be etched, before or after the temperature compression sub-step, in order to form solder pads 4 and/or conductive tracks.

The insulating layers 10, 11, 12 of the printed circuit 2 can comprise, in a manner known per se, an epoxy resin and glass fibers. As for the conductive layers $C_1$ to $C_4$, they can be made of copper (or a copper-based alloy).

The cavities 20 can be formed by cutting the layer $C_1$ and the first insulating layer 10. The cutting can be carried out mechanically (using a cutting tool of the mechanical milling or mechanical drilling or laser drilling type). Performing laser drilling can only be achievable from the moment when the surface (in the plane (X, Y)) at the bottom 21 of a cavity 20 is smaller than the copper solder pad 4 so that the solder pad 4 extends beyond the bottom 21 of the cavity 20 to allow the action of the laser $CO_2$ at a depth p on the copper to be stopped.

When the cavities 20 are produced by laser drilling, the laser can be of the gas (carbon dioxide) laser type. Then, the parameters selected for the laser can be similar to those usually used for making laser vias.

The laser drilling technique allows forming cavities 20 with high precision. In particular, it is possible to position cavities 20 with high precision and low dimensional tolerances. Typically, the dimensional tolerance is of the order of 25 microns (for a minimum 100 μm wide cavities 20) when the cavities 20 are made by laser drilling, in contrast to about 100 microns (for a minimum 300 μm wide cavities 20) when they are made by (mechanical or chemical) cutting.

The laser drilling thus allows an increase in the density of the SMD 3 on the printed circuit 2, since the dimension of the cavities 20 can be reduced (the minimum size of the cavity that can be obtained by laser drilling being smaller).

The laser drilling thus allows an increase in the density of the SMD 3 on the printed circuit 2, since the distance between two cavities 20 can be reduced (the positioning and dimensional tolerances being smaller).

Figure 7:
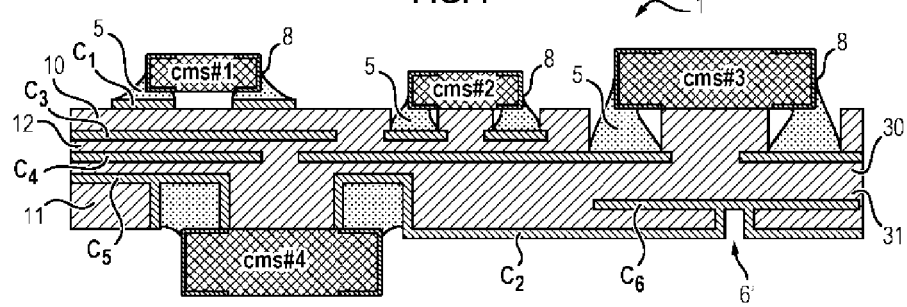

The shape of the cavities 20 is preferably cylindrical, in particular when they are obtained by laser drilling, by mechanical cutting or by mechanical drilling. The section in the plane (X, Y) of the cavities 20 can be arbitrary, for example circular, rectangular, etc.

Where appropriate, one or more through vias 6 can also be made in the printed circuit 2 according to conventional techniques.

Where appropriate, one or more laser vias 6' can also be made in the printed circuit 2 according to conventional techniques (see in particular FIG. 7).

Figure 1D:
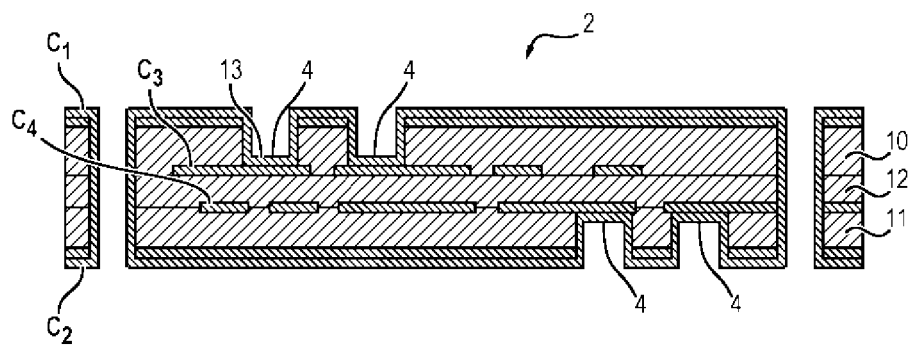

In a first variant embodiment illustrated in FIG. 1d, the cavities 20 can be metallized (step S2) before filling S5 them with a metal alloy accompanied by a solder flux. The metallization S2 has the effect of depositing a thin metal layer 13 (with a thickness of a few micrometers) on the walls of each cavity 20.

The layers $C_1$ and $C_2$ and the solder pads 4 are generally made of copper, the deposited metal layer 13 is a copper layer the thickness of which can be of the order of twenty micrometers.

The metallization of the cavities 20 can be carried out by any conventional technique, for example by electrolysis. The copper layer 13 can comprise a first copper layer called "chemical" copper layer followed by the deposition of a second copper layer called "electrolytic" copper layer and covers the bottom 21 of the cavities 20 (corresponding substantially to the solder pad 4) and the exposed surfaces of the first and the second insulating layer 10, 11 (which form the vertical walls 22 of the cavities 20).

In one embodiment, both the layers $C_1$, $C_2$ and the cavities 20 are metallized during this step. The layers $C_1$, $C_2$, the solder pads 4 and the vertical walls 22 of the cavities 20 are covered with a copper layer 13, a result of the deposition of a chemical copper followed by a deposition of electrolytic copper.

Figure 1E:
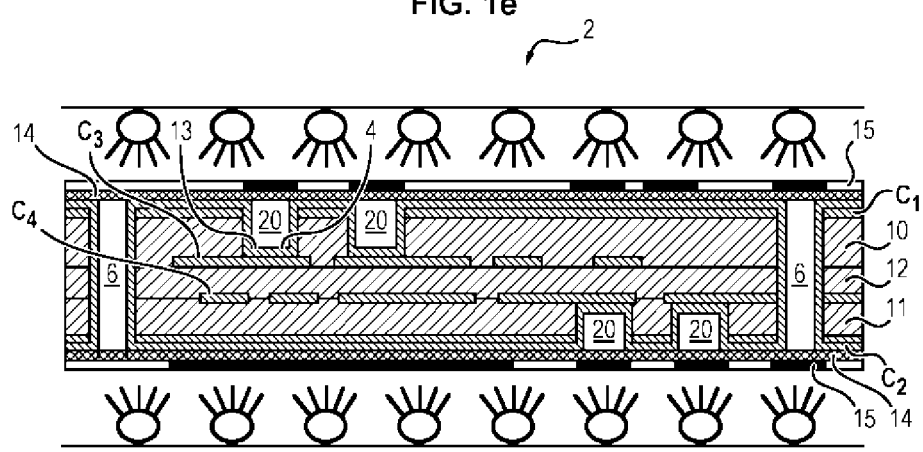
Figure 1F:
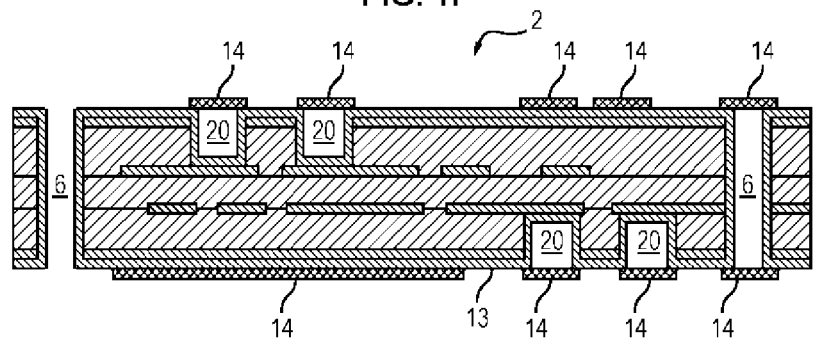

Furthermore, the method S can comprise a step of etching the layer $C_1$ (FIG. 1e). For this purpose, in a manner known per se, a photosensitive film 14 is applied on the free face of the layers $C_1$ and $C_2$. The photosensitive film 14 is preferably a positive resin (the ultraviolet radiation causes the macromolecules to rupture, resulting in an increased solubility of the areas exposed in the developer solvent). The resin may in particular comprise an epoxy resin.

A mask 15 (or offset film) is then applied on the photosensitive film 14. The mask 15 comprises transparent areas and opaque areas in order to allow the etching of the layer $C_1$ and to form, for example, conductive tracks 16 and/or a flange 23 at the outlet of one or more cavity/cavities 20. In the example illustrated in FIG. 1e, the offset film 15 comprises for example opaque areas at the two cavities 20, at the via 6 and at two areas intended to form conductive tracks 16.

Finally, the photosensitive film 14 is exposed to light radiation: in the case of a positive resin (typically epoxy resin), the parts of the film 14 present under the transparent areas will then react to this light radiation and dissolve, while the parts present under the opaque areas will be protected therefrom. Alternatively, the offset film 15 is insolated by a laser method (generally known under its terminology of Laser Direct Insolation LDI).

In all cases, the solubilized parts are then removed using a developer solvent, which allows partly uncovering the layer $C_1$. The non-solubilized parts of the photosensitive film 14 remain above the two cavities 20, the via 6 and the two areas intended to form conductive tracks 16.

Figure 1G:
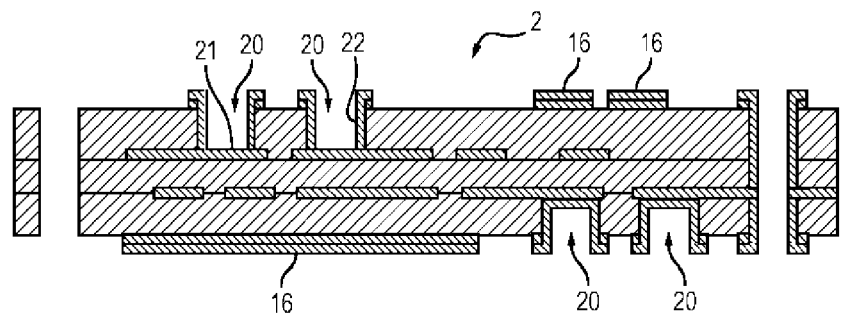
Figure 1H:
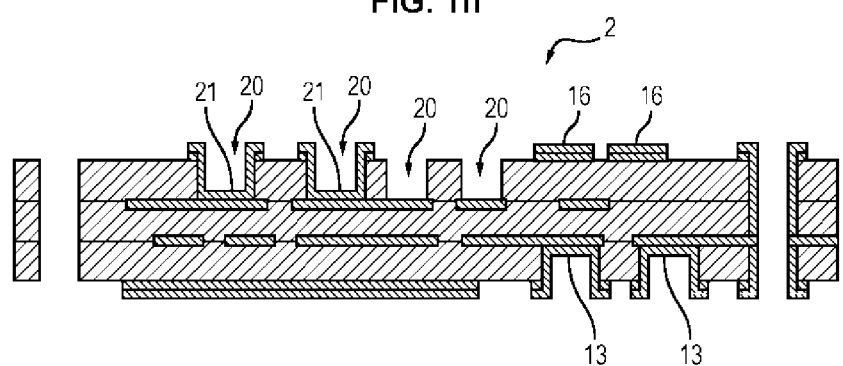
Figure 1I:
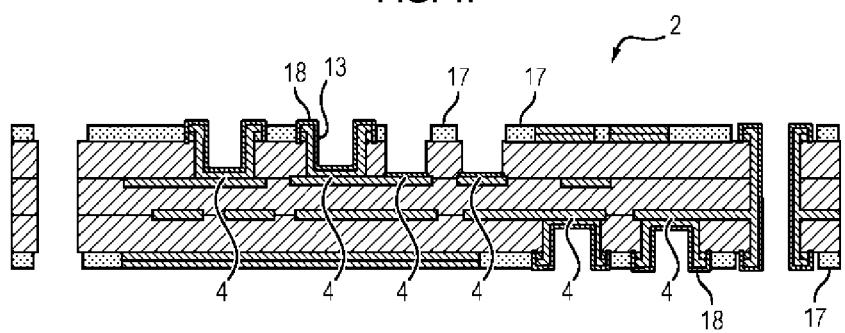

The areas not protected by the photosensitive film 14 can then be etched until the copper has completely disappeared, for example by electrolysis (FIG. 1g).

This etching method S being known per se, it will not be detailed further here.

Figure 1J:
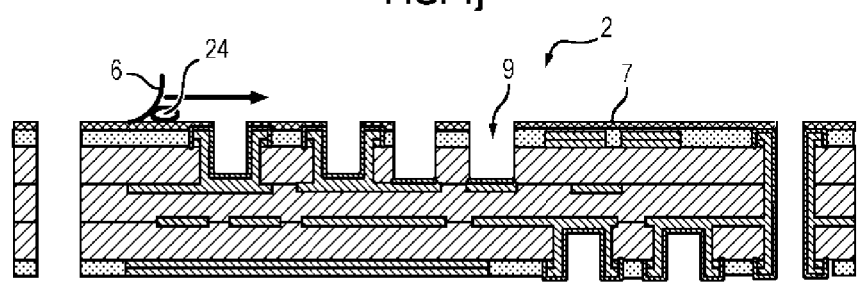
Figure 1K:
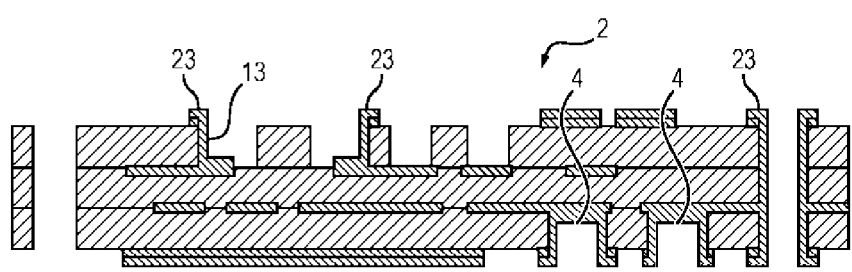
Figure 1L:
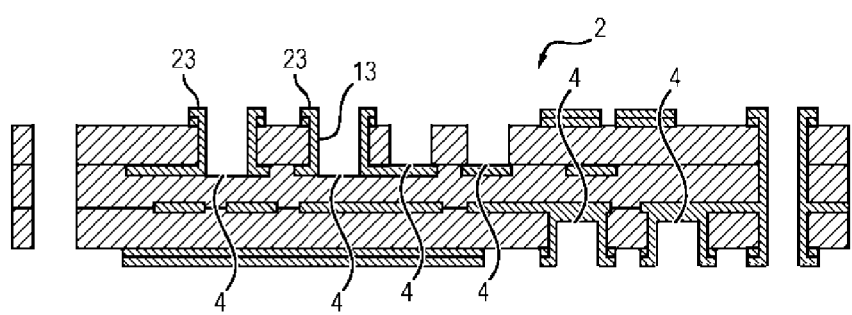

Optionally, part of the metallization can be removed (step S3), so as to obtain one or more partially metallized cavity/cavities (FIGS. 1k and 1l). This removal S3 can be performed at all the cavities 20 formed in the layers $C_1$ and $C_2$, at only part of the cavities 20 formed in the layers $C_1$ and $C_2$, or else differently depending on the cavities 20 formed in the layers $C_1$ and $C_2$, in order to adapt the metallization of each cavity 20 to the type of terminal 8 intended to be attached into said cavities 20. The partial removal may also concern all or part of the layers $C_1$ and $C_2$, in order to form one or more (complete or partial) flange(s) 23.

This removal can in particular be performed by laser, in order to drill the chemical copper layer. The partial removal S3 may concern:
  all or part of the metal layer 13 deposited on the vertical walls 22 of one or more cavity/cavities 20 and/or
  all or part of the metal layer 13 deposited at the bottom 21 of one or more cavity/cavities 20 and/or
  all or part of the metal layer 13 deposited on the layers $C_1$ and/or $C_2$.

Where appropriate, the laser can be inclined relative to the vertical walls 22 of the cavity 20 in order to have a non-zero strike angle in order to better remove the metallization from the vertical walls 22.

Figure 2A:
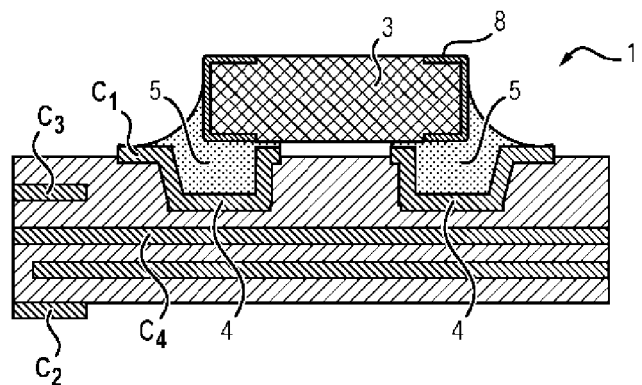
FIGS. 2a to 2c are partial sectional views of three exemplary embodiments of electronic boards comprising partially or fully metallized cavities into which an exemplary component is soldered.

For example, FIG. 2a illustrates an example of a part of an electronic board 1, in which the cavity 20 has been metallized but where the metal layer 13 has not been removed.

Figure 2B:
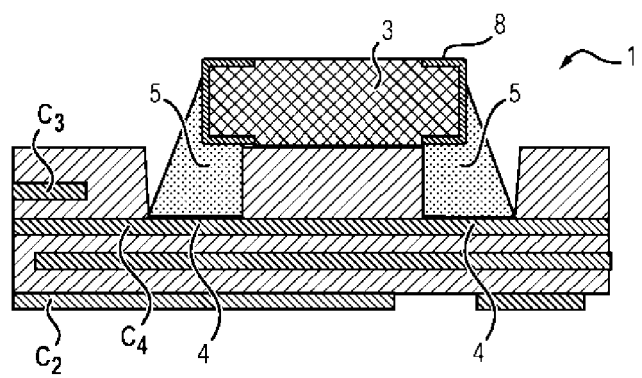

Moreover, FIG. 2b illustrates the case where the metal layer 13 has been removed over the entire vertical wall 22 of the cavities 20 and at the outlet of the cavities 20, but has been left at the bottom 21 of the cavity 20.

Figure 2C:
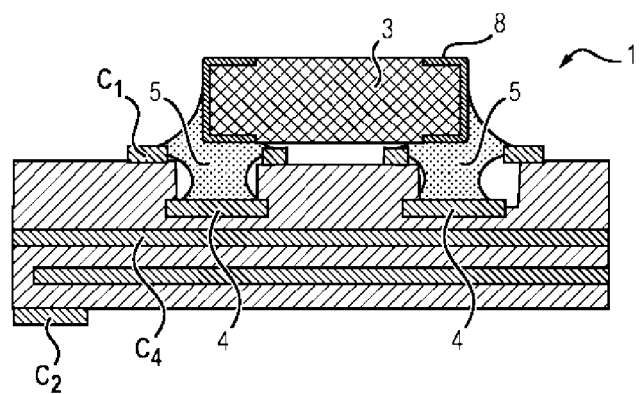

FIG. 2c illustrates the case where the metal layer 13 has been removed over the entire vertical wall 22 of the cavities 20 but has been left at the bottom 21 of the cavity 20 and at the outlet of the cavity 20, thus forming two flanges 23 in the layer $C_1$.

Figure 3A:
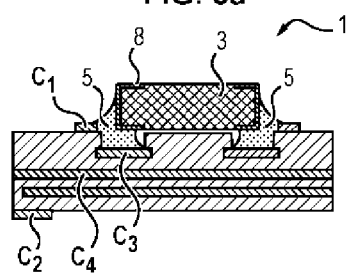
Figure 3B:
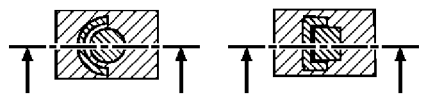
FIG. 3b is a view of two exemplary embodiments of the cavity on the left of the example of FIG. 3a before filling.

FIGS. 3a and 3b illustrate the case where the metal layer 13 has been removed over the entire vertical wall 22 of the cavities 20 but has been left at the bottom 21 of the cavity 20 and over part of the outlet of the cavities 20, thus forming two half-flanges 23 in the layer $C_1$.

Figure 4A:
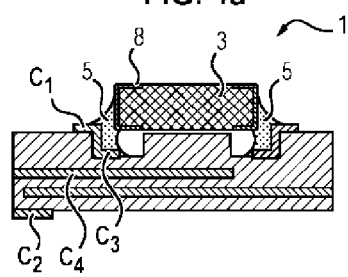
Figure 4B:
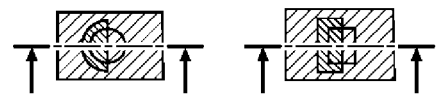
FIG. 4b is a top view of the cavity of the example of FIG. 4a before filling.

FIGS. 4a and 4b illustrate the case where the metal layer 13 has been removed over half of the periphery of the vertical wall 22 of the cavities 20, over half of the bottom 21 of the cavity 20 and over part of the outlet of the cavities 20 to form two half-flanges 23 in the layer $C_1$.

It will be understood that step S3 of partially removing the metal layer 13 can be carried out before or after the layer $C_1$ etching step.

Where appropriate, one or more non-metallized cavity/cavities 20 can also be made in the layer $C_1$ (step S4) after the metallization step S2, by a laser drilling of the layer $C_1$ and of the first insulating layer 10.

Alternatively, the non-metallized cavities 20 can be obtained, as indicated above, by removing the copper layer from the cavity 20 already formed (during step S3).

Conventionally, a solder mask layer 17 can then be applied on the exposed surfaces of the first insulating layer 10 and, where appropriate, on the conductive tracks 16, without covering the parts requiring electrical contact with the outside (such as the vertical walls 22 of the cavities 20, their possible flange 23 or else a grounding contact for example).

A finish 18 can also be deposited in order to protect the copper that remains exposed and to maintain the ability of the pads 4 to receive a solder joint 5. The finish 18 can comprise, in a manner known per se, an organic finish (Organic Solder Preservative, OSP) or a metallic finish comprising at least one of the following alloys: chemical nickel/gold, galvanic nickel/gold, chemical tin, chemical silver. The thickness of the finish 18 can be of the order of a few microns and can be applied to all exposed copper surfaces.

Where appropriate, a finish 18 by Hot Air Leveling (HAL) based on an alloy of the lead/tin or tin type may be used.

The cavities 20 can be filled by screen-printing with a solder paste 24 comprising the metal alloy suspended in the solder flux.

For this purpose, during a first sub-step, a screen-printing (or stencil) screen 7 in which two windows 9 have been formed (one per cavity 20 formed) is placed on the layer $C_1$. The screen 7 is positioned so that each window is facing the corresponding cavity 20 to be filled.

Of course, the screen 7 may comprise a different number of windows 9 if a different number of cavities 20 must be filled.

The dimensions of the windows 9 are substantially equal to the dimensions of the associated cavity 20 to be filled in order to optimize the filling of the cavity 20. Preferably the dimensional precision for making the windows 9 is of the order of thirty micrometers. The windows 9 may be slightly larger than the associated cavity 20 in order to ensure that they are filled properly and to increase the amount of solder paste 24 deposited.

During a second sub-step, solder paste 24 is deposited on the screen 7 then forced into the windows 9 and into the cavities 20 using a squeegee (see FIG. 1j). In a manner known per se, the squeegee may comprise a metal sheet, which is inclined at an angle that may be comprised between 45° and 60° in order to better push the solder paste 24 into the cavity 20.

During a third sub-step, the screen 7 can be demolded so as to leave the solder paste 24 in the cavities 20. It will be noted that the thickness of the deposited solder paste 24 being greater than the thickness of the layer $C_1$ and the first insulating layer 10, due to the presence of the screen 7 during filling.

Then, an SMD 3 can be placed on the layer $C_1$, so that each terminal 8 is located above a cavity (step S6), then the heat treatment S7 can be applied to the electronic board 1.

The three sub-steps described above for filling the cavities 20 by screen-printing are then repeated for the cavities 20 of the layer $C_2$.

In a variant embodiment, the cavities 20 can be filled by screen-printing with a solder paste 24 without using a screen 7. In fact, the squeegee can be displaced directly on the free face of the printed circuit 10: the layer $C_1$ and the first insulating layer 10 (respectively, the layer $C_2$ and the second insulating layer 11) act as a screen 7 effect. When the squeegee reaches a cavity 20, then it forces the solder paste 24 into the cavity 20 in a similar manner to which is usually done with a screen 7.

In order to avoid the presence of solder paste 24 on top of the layers $C_1$ and $C_2$, it is preferable to use a polymer squeegee 6. The few remaining alloy balls can then be removed by washing after the heat treatment step. After filling the cavities 20, the layer $C_1$ and the first insulating layer 10 (respectively, the layer $C_2$ and the second insulating layer 11) are, however, not demolded. Moreover, they will serve as a support for the SMD 3 and will play a role in maintaining the solder paste 24 during the heat treatment.

This embodiment without screen 7 thus allows reducing the manufacturing costs of the electronic board 1 to the extent that it is no longer necessary to produce a screen-printing screen 7 and to use equipment requiring high precision (no more screen 7 to be positioned face-to-face with the printed circuit 2). Furthermore, the step S5 of filling the cavities 20 is facilitated since it is no longer necessary to precisely position a screen 7 on the layers $C_1$ and $C_2$.

According to yet another variant, the cavities 20 can be filled S5 by jetting of the metal alloy accompanied by the solder flux, by passing through a turbulent wave of molten metal alloy accompanied by the solder flux, by soaking or passing through a bath of metal alloy in reflow or else by wave soldering or by manual soldering.

The dimensions of the cavities 20 are selected so that each cavity 20 exposes at least part of the facing solder pad 4 and that the service life of the terminal 8 of the SMD 3 soldered into this cavity 20 is sufficient. For example, each cavity 20 can be dimensioned so as to cover and extend beyond the solder pad 4. The definition of the dimensions of each cavity 20 depends on the terminals 8 of the component SMD 3 to be assembled. For example, for a 0603 size package, which comprises several terminals 8, the cavities 20 can have dimensions of the order of 0.5 mm*1 mm; for 1206 size packages: 1 mm*2 mm; for 2010 size packages, the cavities 20 can have dimensions of the order of 1.5 mm*4.5 mm. For fine pitch-type packages, the width of the cavities 20 can for example be of the order of 0.3 mm. The surface of the bottom 21 of each cavity 20 is therefore greater than the solder pad 4 surface which it exposes. However, this is not limiting, the cavities 20 can be dimensioned so as not to extend beyond the solder pad 4 which they expose.

The thicker the first insulating layer 10 and the layer the greater the depth p of the cavities 20 and the greater the thickness of the solder paste 24 introduced into the cavities 20. In fact, in the case where the cavities 20 are filled with solder paste 24 by screen-printing with a screen 7, the size of the windows 9 of the screen-printing screen 7 is no longer limited by the possibility of demolding the screen 7 after filling the cavity 20, since the layer $C_1$ and the first insulating layer 10 remain on the solder pad 4 and are not demolded. Consequently, the height of the solder paste 24 introduced into each cavity 20 is equal to the sum of the cavity 20 depth p and the screen 7 thickness, the screen 7 thickness may be small when the thickness of the layer $C_1$ and of the first insulating layer 10 is large.

More specifically, the size of a screen-printing screen 7 window 9 is limited by the ratio between the window 9 surface (in the plane of the screen 7, which is parallel to the plane (X, Y)) and the surface of the inner walls of the window 9 (which extend perpendicular to the plane of the screen 7), which must be greater than or equal to 0.66. Until now, it was either necessary to reduce the thickness of the screen 7, which involved reducing the amount of the solder paste 24 and therefore the standoff of the SMD 3, or to increase the window 9 surface, which prevented the implantation of fine pitch SMD 3 or limited the density of SMD 3 that can be implanted on the printed circuit 2.

The formation of the cavities 20 in the layer $C_1$ and in the first insulating layer 10 therefore moves the upper face of the solder pad 4 away from the low point of the conductive terminals 8 of the SMD 3 once soldered which, quite advantageously, allows lifting this limitation to the extent that it becomes possible to drastically increase the height of the solder paste 24 applied on the printed circuit 2, without modifying the thickness of the screen-printing 7 screen. Where appropriate, it is even possible, during the production of the printed circuit 2, to increase as much as necessary the thickness of the first insulating layer 10 and to produce a window 9 having a surface adapted to the surface of the associated cavity 20, its thickness being dictated by the above ratio so that it remains greater than 0.66.

Thus, the invention allows dispensing with the difficulties of demolding the screen-printing screen 7, when such a screen 7 is used and makes possible the implantation of fine pitch SMD 3 and/or a high density of SMD 3 on the electronic board 1. Typically, it can be considered to use a screen 7 having a thickness of the order of 50 μm to 100 μm with possible local thicknesses of 100 μm to 300 μm if necessary.

It will of course be understood that the removal of the screen-printing screen 7, enabled by the formation of the cavity 20 in the layer $C_1$ and in the first insulating layer 10, also allows implanting fine pitch SMDs 3 on the printed circuit 2 and/or increasing the density of SMD 3 on the printed circuit 2, since the method S for filling the cavities 20 does not require demolding a screen 7.

Optionally, in order to increase the depth p of the cavity 20, the method S may further comprise a step of applying an additional layer 19 comprising an electrically insulating material on one or both of the layers $C_2$, before the heat treatment step S7 and where appropriate after the step of etching the layer $C_1$. In the exemplary embodiment illustrated in FIG. 5, the additional layer 19 is for example applied on the layer $C_1$.

The additional layer 19 can cover all or part of the underlying layer ($C_1$ and/or $C_2$). The cavities 20 are then partly formed in said additional layer 19. In other words, the upper part 25 of the cavities 20 can be made in the additional layer 19. Where appropriate, this upper part 25 may have larger dimensions than the rest of the associated cavity 20.

The additional layer 19 may in particular comprise any electrically insulating material. Where appropriate, the material constituting the additional layer 19 may be heat conductive. Moreover, depending on the thermal and vibratory environment and in order to further increase the service life of the printed circuit 2, the material of the additional layer 19 can be selected so as to have a greater coefficient of thermal expansion in Z-direction than that of the metal alloy.

Typically, the additional layer 19 can comprise at least one of the following materials: glass fibers, epoxy resin, polyimide, polyester, polymer, teflon.

The additional layer 19 can be applied by any means to the layer before or after forming the cavities 20 in the layer $C_1$ and in the first insulating layer 10.

In one embodiment, the additional layer 19 can be added and attached onto the layer $C_1$ and/or $C_2$, for example by lamination or gluing using an adhesive layer. The adhesive layer can comprise any type of adhesive material conventionally used in the field of printed circuits in order to adhere layers together, typically an epoxy glue. The upper part 25 of the cavities 20 can then be pre-formed in the additional layer 19 before it is placed on the layer $C_1$ and/or $C_2$, or even after its attachment.

For example, the upper part 25 of the cavities 20 can be formed by cutting the additional layer 19. The cutting of the upper part 25 of the cavities 20 in the additional layer 19 being similar to that of the rest of the cavities 20 (ex: cutting of the type mechanical milling or mechanical drilling or laser drilling) in the insulating layers 10, 11, it will not be detailed again here.

Where appropriate, the additional layer 19 may comprise a printed circuit 2, which can be added and attached onto the layer $C_1$ and/or $C_2$ by soldering or gluing. In one embodiment, the upper parts 25 of the cavities 20 are then made in the printed circuit 2. The printed circuit 2 forming the additional layer 19 can then extend over all or part of the layer $C_1$. Alternatively, it can extend only locally, under the SMD 3. This embodiment is particularly interesting in the case where the SMD 3 comprises gull wing legs 8, the assembly of which tends to break.

It will be noted that the moment when the additional layer 19 is placed on the layer $C_1$ and/or $C_2$ depends on the technique for depositing the additional layer 19 and for forming the cavities 20. For example, in the case where the cavities 20 are produced by laser drilling, it is preferable to form the cavities 20 in the additional layer 19 before it is deposited on the layer $C_1$ and/or $C_2$, to guarantee that the laser is stopped.

Figure 5:
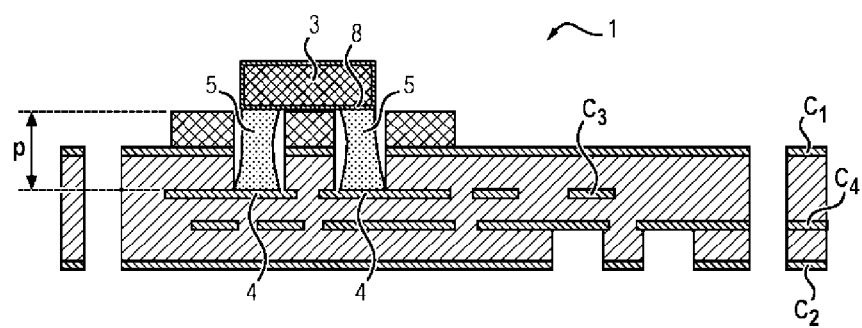
FIGS. 5 to 8 are examples of electronic boards in accordance with the invention.

Adding the additional layer 19 allows increasing the depth p of the cavities 20 and thus increasing the standoff of the SMD 3. Furthermore, this additional layer 19 is interesting when the thickness of the first insulating layer 10 is small and therefore does not alone allow forming cavities 20 having a depth p which is sufficient to achieve the desired service life.

Where appropriate, the additional layer 19 can only be applied over part of the layer for example under some SMD 3 only, as illustrated in FIG. 5. A staged screen-printing screen can then be used in order to fill the cavities 20 underlying the additional layer 19 at the same time as the other cavities 20.

The heat treatment step S5 can in particular comprise a reflow soldering of the metal alloy present in the solder paste 24. For this purpose, during a first sub-step called ramp up sub-step, the temperature is gradually increased. In a manner known per se, this ramp up step can be carried out along a slope comprised between 1° C./s and 4° C./s until 100° C. to 150° C. (maximum 7° C./s, maximum temperature slope recommended by the SMD 3 components before soldering).

During a second sub-step called preheating sub-step, the operation of flux drying ("soaking" or "preflowing") and of preparing the cleaning of the solder terminals 8 of the printed circuit 2 and the SMD 3 takes place, the temperature is gradually increased to about 170° C. and maintained for at least one minute and a half to several minutes (depending on the fluxes used) in order to allow the evaporation of the volatile parts of the solder flux and the temperature uniformity of all components before the reflow phase.

During a third sub-step called reflow sub-step, the temperature is increased again until it reaches a critical temperature, generally higher by 20 to 50° C. above the melting temperature of the alloy of the metal alloy used. When the temperature passes through the melting point of the metal alloy contained in the solder paste 24 (for example about 180° C. when the metal alloy comprises a tin/lead alloy 63/37, of the order of 217° C. in the case of a tin/silver/copper metal alloy 95.6/3.0/0.5 and about 221° C. in the case of a tin/silver metal alloy 96.5/3.5), the metal alloy melts 21. It will be noted that at all times, the metal alloy which is liquid remains in contact with the terminals 8 of the SMD 3 and the solder pad 4 of the layer $C_3$ under the effect of wettability.

Preferably, the increase in temperature during the reflow step is rapid and in all cases faster than the ramp up step in order to prevent the SMD 3 from being subjected to high temperatures for a long time. The printed circuit 2 can also be maintained at the critical temperature higher the melting temperature of the alloy for a period which can be comprised between twenty and ninety seconds, depending on the thermal mass of the components to be assembled. This time above the alloy melting temperature allows creating intermetallics which will ensure maintaining the components between the metal alloy and the parts to be assembled.

During a fourth sub-step, the printed circuit 2 is rapidly cooled to room temperature. When the temperature passes again through the melting point and becomes lower than the melting temperature of the metal alloy, the latter solidifies, thus forming the solder joint 5. The first insulating layer 10 (which extends between the first layer $C_1$ and the layer $C_3$) then guarantees a minimum standoff between the upper face of the solder pad 4 and the low point of the conductive terminals 8 of the SMD 3 once soldered, which cannot be less than the thickness of the first insulating layer 10. Where appropriate, when an additional insulating layer 19 is applied to the layer $C_1$, the minimum standoff is at least equal to the sum of the thickness of the first insulating layer 10 and the thickness of the additional layer 19.

It will be noted that the solder flux gradually evaporates during the ramp up (and preheating/drying) step, thus leaving only the metal alloy on the solder pad 4. Therefore, the solder joint 5 only comprises the metal alloy.

The reflow heat treatment is well known in the technical field of soldering SMDs 3, so that it is not necessary to detail it here. Moreover, the temperatures, slopes and durations of the different heat treatment steps are given here by way of example and of course depend on the solder paste 24 used. Therefore, a person skilled in the art will know how to adapt them without difficulty depending on the type of metal alloy and solder flux used.

As can be seen, the method S of the invention allows using any type of solder paste 24, and in particular lead-free solder pastes, thus allowing to comply with the current standards and in particular the European Directive RoHS no 2002/95/EC—ban on Lead, Hexavalent Chromium, Mercury, Cadmium, Polybromobiphenyl and decabromodiphenyl ethers. For example, the metal alloy of the solder paste 24 can comprise one of the following compositions, which are the most commonly used: tin/lead 63/37 or 10/90 or 90/10, tin/lead/Silver 62/36/2, for the products exempt from the Rohs directive or tin/silver alloys 96.5/3.5., Tin/silver/ copper 96.5/3.8/0.7 or 96.6/3.0/0.5 or 98.5/1.0/0.5. This technique is suitable for all types of alloy (comprising bismuth, antimony, etc.)

In a manner known per se, the solder flux depends on the type of metal alloy suspended in the solder paste 24 and on the assembly process with or without cleaning. The solder flux generally comprises a resin (typically a natural, modified or synthetic resin), activating agents and additives allowing to optimize the screen-printing and the reflow. The role of the solder flux is to ensure the stripping of the solder pads 4 (using activators), to ensure their protection during the ramp up steps and to play a surfactant role to promote wetting of the metal alloy. For example, the solder flux may comprise rosin.

It may be advantageous to solder terminals 8 of a same SMD 3 into cavities 20 of different depth p, or to solder at least one terminal 8 on the surface while the other terminals 8 are soldered into cavities 20. In fact, in a general manner, the forces applied to the terminals 8 are not identical for the same SMD 3: staging the soldering of the terminals 8 thus allows adapting the soldering to the forces received by each terminal 8.

For example, it is possible to solder part of the terminals 8 on the surface, on the layer $C_1$ (respectively, the layer $C_2$) and the rest of the terminals 8 into cavities 20. Preferably, the terminals 8 undergoing the most stresses are soldered into cavities 20, in order to increase their service life by reducing the shear angle for a same relative displacement of the SMD 3 relative to the printed circuit 2, while the others can be soldered on the surface.

This embodiment is in particular advantageous in the case of SMD 3 of the BGA type (acronym for Ball Grid Array): the terminals 8 located in the areas adjacent to the corners of the BGA are exposed to more constraints than the terminals 8 located in the central part of the BGA or in the middle of the BGA sides. The terminals 8 located in these areas can therefore be soldered into cavities 20.

This embodiment can also be advantageous when the SMD 3 comprises legs: the legs located in the central part of the SMD 3 can be soldered on the surface (respectively, into a cavity 20 at a first depth p) while the legs located at the end of the SMD 3 can be soldered into a cavity 20 (respectively, into a cavity 20 at a second depth p, greater than the first depth p).

Examples of electronic board 1 comprising different SMDs 3 attached in accordance with the method S of the invention will now be described with reference to FIGS. 6 to 8.

Figure 6:
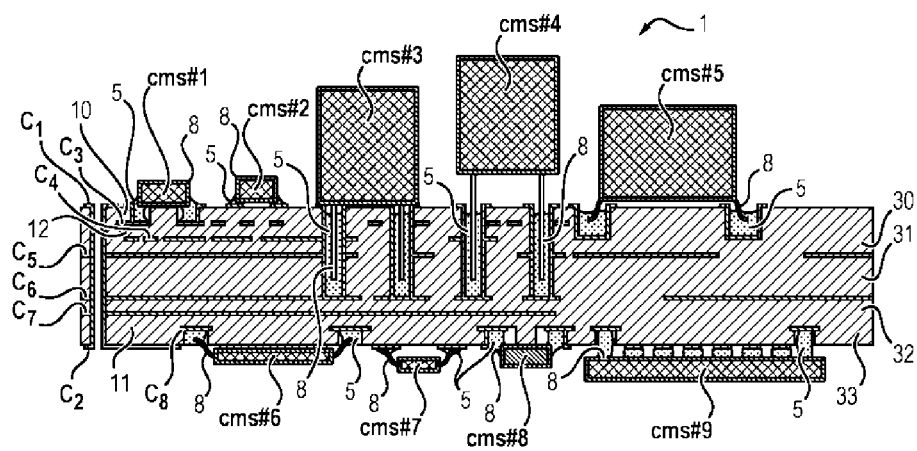

FIG. 6 illustrates an electronic board 1 comprising two conductive skin layers $C_1$ and $C_2$ and six inner conductive layers $C_3$, $C_4$, $C_5$, $C_6$, $C_7$ and $C_8$ which extend between the layers $C_1$ and $C_2$ and are separated in pairs by insulating layers 10, 11, 12, 30, 31, 32 and 33.

A first SMD 3 (SMD #1) is soldered into cavities 20 formed in the layer $C_1$ and in the first insulating layer 10. As can be seen in this figure, the vertical walls 22 of these cavities 20 are partially metallized (over half of the periphery of the vertical wall 22 of the cavities 20, at the bottom 21 and over part of the outlet of the cavities 20 in order to form half-flanges 23).

A second SMD 3 (SMD #2) is conventionally soldered on the layer $C_1$.

A third and a fourth through-hole technology components (SMD #3 and SMD #4) mounted unconventionally "on the surface" are soldered into cavities 20 formed in the layer $C_1$ and in the first (10), the third (12), a fourth (30) and a fifth (31) insulating layer. As can be seen in this figure, the vertical walls 22 of these cavities 20 and their outlets are metallized through a flange 23.

A fifth SMD 3 (SMD #5), comprising gull wing legs, is soldered into cavities 20 formed from layer $C_1$ to layer $C_4$ through the first insulating layer 10, the layer $C_3$ and the third insulating layer 12. As can be seen in this figure, the vertical walls 22 of these cavities 20 and their outlets are metallized through a flange 23.

A sixth SMD 3 (SMD #6), comprising gull wing legs 8, is soldered into cavities 20 formed in the layer $C_2$ and in the second insulating layer 11. As can be seen in this figure, only the bottom 21 of these cavities 20 is metallized.

A seventh SMD 3 (SMD #7), comprising gull wing legs 8, is conventionally soldered on the layer $C_2$.

An eighth SMD 3 (SMD #8) is soldered into cavities 20 formed in the layer $C_2$ and in the second insulating layer 11. As can be seen in this figure, the vertical walls 22 of these cavities 20 are partially metallized (over half of the periphery of the vertical wall 22 of the cavities 20, over half of their bottom 21 and over part of the outlet of the cavities 20 in order to form half-flanges 23).

A ninth SMD 3 (SMD #9), which can correspond to a BGA and comprises a plurality of terminals 8, is partly soldered in a conventional manner on the layer $C_2$ and partly soldered into cavities 20 formed in the layer $C_2$ and in the second insulating layer 11. The terminals 8 soldered into cavities 20 here correspond to the terminals 8 located at the ends of the ninth SMD 3.

Thus, this electronic board 1 comprises nine SMD 3 having different sizes and all have a standoff adapted to the SMD 3. More particularly, it can be seen that the standoff of the second and the seventh SMD (SMD #2 and SMD #7) is small, while the standoff of the other SMDs 3 is high and at least equal to the number of insulating layers 10, 11, 12 and conductive layers between the layer $C_1$ or $C_2$ on which the SMD 3 is attached and the solder pad 4 of the SMD 3.

FIG. 7 illustrates an electronic board 1 comprising two conductive skin layers $C_1$ and $C_2$ and four inner conductive layers $C_3$, $C_4$, $C_5$ and $C_6$, which extend between the layers $C_1$ and $C_2$ and are separated in pairs by insulating layers 10, 11, 12, 30, 31.

A first SMD 3 (SMD #1) is conventionally soldered on the layer $C_1$.

A second SMD 3 (SMD #2) is soldered into cavities 20 formed in the first insulating layer 10. As can be seen in this figure, the vertical walls 22 and the outlet of these cavities 20 are not metallized.

A third SMD 3 (SMD #3) is soldered into cavities 20 formed in the first insulating layer 10 and in the third insulating layer 12. As can be seen in this figure, the vertical walls 22 and the outlet of these cavities 20 are also not metallized.

A fourth SMD 3 (SMD #4) is soldered into a cavity 20 formed in the second insulating layer 11 and in a fifth insulating layer 31. As can be seen in this figure, the vertical walls 22 and the bottom 21 of these cavities 20 are metallized, but not their outlet.

Thus, this electronic board 1 comprises four SMDs 3 with different sizes and all have a standoff adapted to the SMD 3. More particularly, it can be seen that the standoff of the first SMD 3 is small, while the standoff of the second, third and fourth SMD 3 is high. For example, the standoff of the third SMD 3 (SMD #3) is equal to the thickness of the layer of the first insulating layer 10, of the layer $C_3$, and of the third insulating layer 12.

Thus, this electronic board 1 comprises four SMDs 3 with different sizes and all have a standoff adapted to the SMD 3.

More particularly, it can be seen that the standoff of the first SMD (SMD #1) is small, while the standoff of the third and the fourth (SMD #3 and SMD #4) is high and equal, respectively, to the thickness of the first and third insulating layers 10, 12 and to the thickness of the second and the fifth insulating layer 11, 31.

Figure 8:
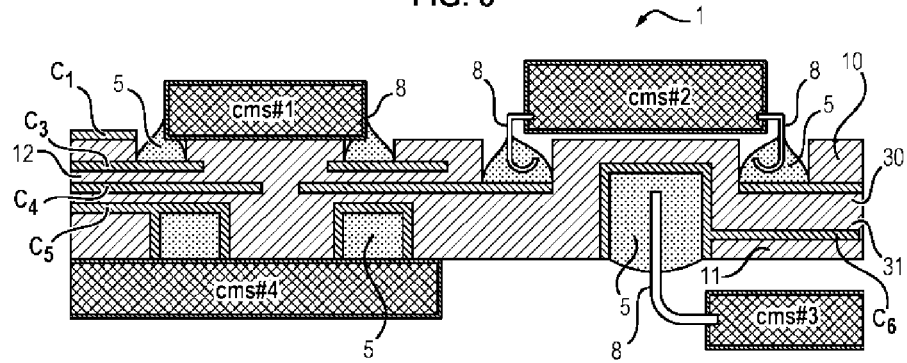

FIG. 8 illustrates an electronic board 1 comprising two conductive skin layers $C_1$ and $C_2$ and four inner conductive layers $C_3$, $C_4$, $C_5$ and $C_6$, which extend between the layers $C_1$ and $C_2$ and are separated in pairs by insulating layers 10, 11, 12, 30, 31.

A first SMD 3 (SMD #1), which can be of the LCC (acronym for Leadless Chip Carrier), LGA (acronym for Land Grid Array) or QFN (acronym for Quad Flat No-lead), is soldered into cavities 20 formed from layer $C_1$ in the first insulating layer 10. As can be seen in this figure, the walls of these cavities 20 are not metallized.

A second SMD 3 (SMD #2), which comprises J-leg type terminals 8, is soldered into cavities 20 formed from the layer $C_1$ in the first and in the third insulating layer 10, 12. As can be seen in this figure, the vertical walls 22 and the outlet of these cavities 20 are also not metallized.

A third SMD 3 (SMD #3), which may be of the through-hole technology component type assembled in "pin in paste" (a leg through the solder paste), is soldered into a cavity 20 formed from the layer $C_2$ in the second (11), the fifth (31), the fourth (30) and the third (12) insulating layer. As can be seen in this figure, the vertical walls 22 and the bottom 21 of this cavity 20 are metallized, but not its outlet (no flange 23).

A fourth SMD 3 (SMD #4), which can for example be a BGA, is soldered into a cavity 20 formed from the layer $C_2$ in the second and the fifth insulating layer 11, 31. As can be seen in this figure, the vertical walls 22 and the bottom 21 of these cavities 20 are metallized, but not their outlet (no flange 23).

The invention claimed is:

1. A method for manufacturing an electronic board, the electronic board comprising:
    a first conductive layer formed on a first insulating layer, the first conductive layer having a substantially planar surface defining a plane normal to an axis Z of the electronic board;
    a second conductive layer formed on a second insulating layer;
    a third conductive layer and a fourth conductive layer located between the first insulating layer and the second insulating layer, respectively, the third conductive layer treated such that a part of the third conductive layer forms a solder pad;
    a third insulating layer located between the third conductive layer and the fourth conductive layer so as to separate the third conductive layer and the fourth conductive layer;
the method comprising:
    forming a number of cavities in the first conductive layer and in the first insulating layer so that at least part of the solder pad is exposed, wherein an area of at least one of the cavities in the plane is at least equal to 0.04 mm²;
    filling the number of cavities with a metal alloy accompanied by a solder flux;
    placing an electronic component on or over the first cavity, wherein the electronic component comprises a number of terminals equal to the number of cavities;
    applying a heat treatment to the electronic board having the electronic component on or over the first cavity in order to transform the metal alloy accompanied by the solder flux into a solder joint and to attach each terminal of the electronic component within a corresponding cavity by a solder joint to the electronic board.

2. The method according to claim 1, wherein the electronic component contacts the first conductive layer.

3. The method according to claim 1, wherein the cavity is formed using at least one of the following techniques: surface photolithography, laser drilling, mechanical drilling, mechanical cutting.

4. The method according to claim 1, further comprising metallizing the cavity in order to deposit a metal layer in the cavity.

5. The method according to claim 4, further comprising removing part of the metal layer of the cavity prior to filling the first cavity.

6. The method according to claim 5, wherein removing the part of the metal layer is carried out by laser or by mechanical cutting or by mechanical drilling.

7. The method according to claim 1, wherein the third conductive layer comprises an additional solder pad, and further comprising, prior to applying the heat treatment:
    forming another cavity in the first insulating layer over the additional solder pad so that at least a part of the additional solder pad is exposed;
    filling the another cavity with the metal alloy accompanied by the solder flux; and
    placing another electronic component over the another cavity;
    wherein filling the cavity and the another cavity and placing the electrical component and the another electrical component occurs substantially simultaneously.

8. The method of claim 1, further comprising etching the first conductive layer.

9. The method of claim 1, wherein the first cavity is filled in accordance with at least one of the following filling techniques: screen-printing with a screen-printing screen, screen-printing without screen-printing screen, jetting, passing through a turbulent wave, by soaking or passing through a metal alloy bath in reflow, wave soldering, manual soldering.

10. The method according to claim 1, further comprising, prior to applying the heat treatment, applying an additional insulating layer on the first conductive layer, and wherein the cavity in the first conductive layer and in the first insulating layer is further formed in the additional insulating layer.

11. The method according to claim 1, wherein: the additional insulating layer has a first coefficient of thermal expansion along the axis Z, the metal alloy has a second coefficient of thermal expansion along the axis Z, and the first coefficient of thermal expansion is greater than the second coefficient of thermal expansion.

12. An electronic board having a multilayer printed circuit comprising: a first conductive layer attached to a first insulating layer, the first conductive layer having a substantially planar surface defining a plane normal to an axis Z; a second conductive layer formed on a second insulating layer; a third conductive layer and a fourth conductive layer located between the first insulating layer and the second insulating layer, respectively, the third conductive layer treated so as to form a solder pad; a third insulating layer located between the third conductive layer and the fourth conductive layer so as to separate the third conductive layer and the fourth conductive layer; an electronic component comprising a number of terminals, the electronic component being positioned on or over the first conductive layer, a number of cavities formed in the first conductive layer and in the first insulating layer, the cavities exposing at least partly the solder pad, wherein an area of at least one of the cavities in the plane is at least equal to 0.04 mm$^2$ and wherein the number of cavities formed in the first conductive layer and in the first insulating layer is equal to the number of terminals of the electronic component and each terminal of the electronic component being attached within a corresponding cavity by a solder joint.

13. The electronic board according to claim 12, wherein the cavity comprises a metal layer of metallization.

14. The electronic board according to claim 13, wherein the cavity is partially covered by the metal layer of metallization.

15. The electronic board according to claim 12, further comprising a solder mask on the first conductive layer and on a part of the first insulating layer that is at least partially exposed by the cavity; and/or further comprising a metallic finish on the first conductive layer and surfaces of the third conductive layer that define the cavity.

16. The electronic board according to claim 12, wherein the electronic component comprises an additional terminal, the additional terminal being attached to the first conductive layer by another solder joint.

17. The electronic board according to claim 12, wherein the fourth conductive layer is treated so as to form another solder pad, and further comprising:
    another cavity in the first insulating layer and the second insulating layer; and
    another electronic component comprising another terminal, the another electronic component being on or over the first conductive layer, the another terminal of the another electronic component being attached to the fourth conductive layer by another solder joint.

18. The electronic board according to claim 12, wherein the electronic component further comprises an additional terminal and the fourth conductive layer is treated so as to form a solder pad, and further comprising additional cavity formed in the first insulating layer and in the third insulating layer over the solder pad of the fourth conductive layer, the additional terminal of the electronic component being attached to the solder pad of the fourth conductive layer by a solder joint.

19. The electronic board according to claim 12, wherein the fourth conductive layer is treated so as to form a solder pad, and further comprising:
    another cavity formed in the first insulating layer and in the third insulating layer; and
    another electronic component comprising another terminal, the another electronic component being on or over the first conductive layer, the another terminal of the another electronic component being attached to the solder pad of the fourth conductive layer by the solder joint.

20. An electronic board having a multilayer printed circuit comprising:
    a first conductive layer attached to a first insulating layer, the first conductive layer having a substantially planar surface defining a plane normal to an axis Z;
    a second conductive layer formed on a second insulating layer;
    a third conductive layer and a fourth conductive layer located between the first insulating layer and the second insulating layer, respectively, the third conductive layer treated so as to form a solder pad, wherein the fourth conductive layer is treated so as to form a solder pad;
    a third insulating layer located between the third conductive layer and the fourth conductive layer so as to separate the third conductive layer and the fourth conductive layer;
    a cavity formed in the first conductive layer and in the first insulating layer, the cavity exposing at least partly the solder pad;
    an electronic component comprising a terminal and an additional terminal, the electronic component on or over the first conductive layer, the terminal of the electronic component being attached over the cavity by a solder joint; and
    an additional cavity formed in the first insulating layer and in the third insulating layer over the solder pad of the fourth conductive layer, the additional terminal of the electronic component being attached to the solder pad of the fourth conductive layer by a solder joint.

21. An electronic board having a multilayer printed circuit comprising:
    a first conductive layer attached to a first insulating layer, the first conductive layer having a substantially planar surface defining a plane normal to an axis Z;
    a second conductive layer formed on a second insulating layer;
    a third conductive layer and a fourth conductive layer located between the first insulating layer and the second insulating layer, respectively, the third conductive layer treated so as to form a solder pad, wherein the fourth conductive layer is treated so as to form a solder pad;
    a third insulating layer located between the third conductive layer and the fourth conductive layer so as to separate the third conductive layer and the fourth conductive layer;
    a cavity formed in the first conductive layer and in the first insulating layer, the cavity exposing at least partly the solder pad, wherein an area of the first cavity in the plane;
    another cavity formed in the first insulating layer and in the third insulating layer an electronic component comprising a terminal, the electronic component being positioned on or over the first conductive layer, the terminal of the electronic component being attached over the cavity by a solder joint; and
    another electronic component comprising another terminal, the another electronic component being on or over the first conductive layer, the another terminal of the another electronic component being attached to the solder pad of the fourth conductive layer by the solder joint.

* * * * *